(12) United States Patent
Kawachi et al.

(10) Patent No.: US 6,781,646 B2
(45) Date of Patent: Aug. 24, 2004

(54) LIQUID CRYSTAL DISPLAY DEVICE HAVING GATE ELECTRODE WITH TWO CONDUCTING LAYERS, ONE USED FOR SELF-ALIGNED FORMATION OF THE TFT SEMICONDUCTOR REGIONS

(75) Inventors: Genshiro Kawachi, Hitachi (JP); Tatsuya Ohkubo, Hitachinaka (JP); Hiroshi Kageyama, Hitachi (JP); Yoshiro Mikami, Hitachi (JP); Kazuhito Masuda, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/384,635

(22) Filed: Mar. 11, 2003

(65) Prior Publication Data

US 2003/0169381 A1 Sep. 11, 2003

Related U.S. Application Data

(63) Continuation of application No. 09/601,218, filed as application No. PCT/JP98/00394 on Jan. 30, 1998, now Pat. No. 6,559,906.

(51) Int. Cl.[7] .............................................. G02F 1/136
(52) U.S. Cl. ............................. 349/47; 349/46; 349/43; 349/148; 257/59; 257/72
(58) Field of Search ............................... 349/42, 43, 46, 349/47, 148; 257/59, 72, 412

(56) References Cited

U.S. PATENT DOCUMENTS 5,428,250 A 6/1995 Ikeda et al. ................. 257/761
6,038,008 A 3/2000 Kim et al. ................... 349/138
6,157,421 A 12/2000 Ishii ............................. 349/43
6,559,906 B1 * 5/2003 Kawachi et al. .............. 349/47

FOREIGN PATENT DOCUMENTS

| JP | 0613407 A | 1/1994 |
|----|-----------|--------|
| JP | 06132535 A | 5/1994 |
| JP | 06196703 A | 7/1994 |
| JP | 06250214 A | 9/1994 |
| JP | 06250218 A | 9/1994 |
| JP | 06310724 A | 11/1994 |
| JP | 08008255 A | 1/1996 |

* cited by examiner

*Primary Examiner*—Robert H. Kim
*Assistant Examiner*—Andrew Schechter
(74) *Attorney, Agent, or Firm*—Antonelli, Terry, Stout & Kraus, LLP

(57) ABSTRACT

A liquid crystal display apparatus includes semiconductor elements placed at intersection points between scanning wires and signal wires. Each semiconductor element includes: a semiconductor layer having a channel region and a pair of semiconductor regions which sandwich the channel region and which are each made of a high-resistance region and a low-resistance region; a first electrode formed on the intrinsic semiconductor region with an insulating film interposed therebetween; and second and third electrodes connected to the low-resistance regions. Each scanning wire constitutes the first electrode of the corresponding one of the semiconductor elements. The first electrode has a first wiring formed on the insulating film and second wiring formed in direct contact with a side surface of the first wiring, part of the second wiring being overlaid on part of a high-resistance region with the insulating film interposed therebetween.

16 Claims, 15 Drawing Sheets

F I G. 15
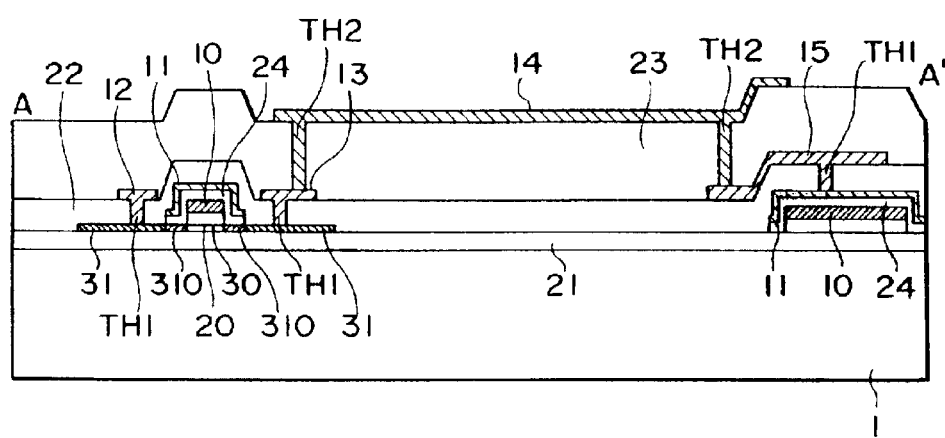
F I G. 16
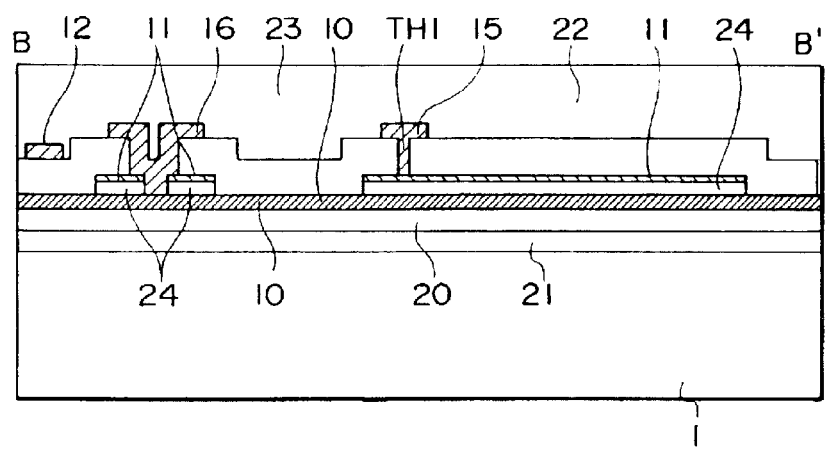

F I G. 25
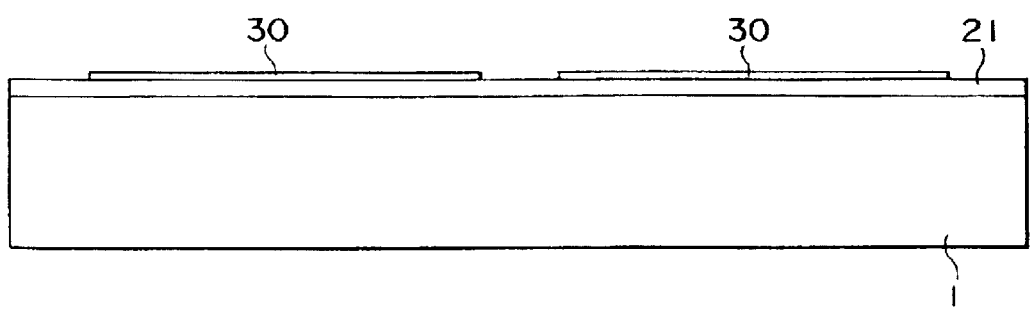
F I G. 26
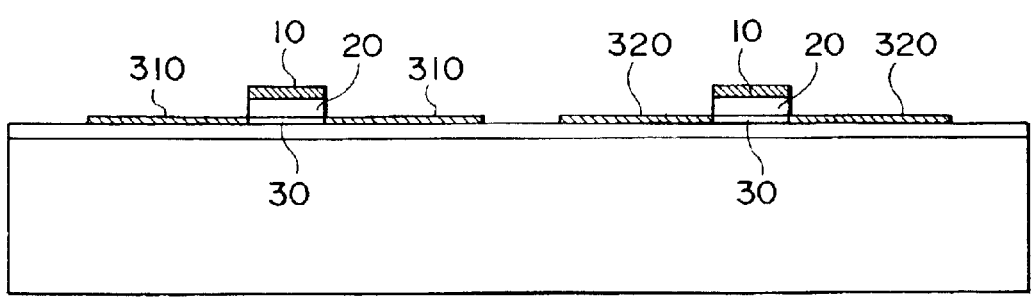

LIQUID CRYSTAL DISPLAY DEVICE HAVING GATE ELECTRODE WITH TWO CONDUCTING LAYERS, ONE USED FOR SELF-ALIGNED FORMATION OF THE TFT SEMICONDUCTOR REGIONS

This is a continuation of application Ser. No. 09/601,218, filed Jul. 28, 2000 now U.S. Pat. No. 6,559,906, which is a 371 of PCT/JP98/00394 filed Jan. 30, 1998, the entire disclosure of which is hereby incorporated by reference.

TECHNICAL FIELD

The present invention relates to semiconductor elements and a liquid crystal display apparatus. More particularly, the invention relates to an active matrix liquid crystal display apparatus of high image quality incorporating highly reliable thin film semiconductor elements.

BACKGROUND ART

There exist active matrix liquid crystal display apparatuses incorporating thin film transistors (TFTs) to display image and text information in combination with OA equipment. For researchers working on this type of liquid crystal display, attaining higher resolution and higher image quality than ever has been a crucial task in addition to the efforts at lowering fabrication costs. To meet the challenges requires improving the performance of TFTs, i.e., a key device of the liquid crystal display. An attempt to form high-performance TFTs on an inexpensive glass substrate is disclosed illustratively in IEEE Transaction on Electron Devices, 1989, Vol. 36, pp. 351–359. The disclosure involves using TFTs to constitute peripheral drivers for driving a TFT active matrix, the TFTs being integrated on a single substrate to reduce fabrication costs. If advanced peripheral drivers are integrated on a glass substrate, the structure of circuits to be mounted externally and their assembling processes will be more simplified, which will translate into substantially reduced mounting costs. To devise a high-performance circuit configuration requires adopting more advanced TFTs than ever before. Today, TFTs formed on a polysilicon film (poly-Si TFTs) are hailed for effective use in liquid crystal display apparatuses that integrate peripheral drivers. In order to form a liquid crystal display apparatus with integrated peripheral drivers on an inexpensive glass substrate, it is necessary to reduce to 350° C. or lower the temperature of a process in which to form the TFTs. In such a low-temperature process, the quality of gate insulating films of the TFTs is not as high as that of thermal oxidation films fabricated at a higher temperature. The comparatively low quality of the TFTs can trigger deterioration of the elements attributable to the injection of hot carriers. In recent years, the mobility of carriers within TFTs has been improved since the introduction of high-quality polysilicon film fabrication technology using laser recrystallization. This has also drawn attention to the importance of viable solutions to the problem of element deterioration. Obviously, degraded TFT characteristics can directly affect the quality of image display; images can flicker or lose their contrast factor due to the concomitant deterioration in the characteristics of drivers or pixel switching elements.

The phenomenon of element deterioration attributable to hot carriers is known to be triggered by high electric fields near drain junctions of transistors. As ways to prevent such degradation, a number of structures have been proposed to attenuate the drain junction field in submicron-order transistors used in silicon LSIs. Illustratively, a dual diffusion drain (DDD) structure having arsenic (As) and phosphorus (P) diffused therein is discussed in IEEE Transaction on Electron Devices, 1983, Vol. 30, pp. 652–657. A lightly doped drain (LDD) structure is proposed in IEEE Transaction on Electron Devices, 1980, Vol. 27, pp. 1359–1367. The proposed LDD structure involves having a low-density impurity diffusion layer interposed between a channel segment and a drain diffusion layer. This structure has since gained widespread acceptance in LSI devices. Some adverse phenomena specific to the LDD structure are minimized by the so-called gate overlapped drain (GOLD) structure having low-density impurity diffusion layers and part of gate electrodes overlapping one another with insulating films interposed therebetween, as proposed in IEEE Transaction on Electron Devices, 1988, Vol. 35, pp. 2088–2093.

Meanwhile, higher levels of resolution and larger display screens of liquid crystal display apparatuses have created a serious problem: signal delays caused by finite wiring resistance and wiring capacity. A number of wiring structures using low-resistance materials such as aluminum (Al) and copper (Cu) have been proposed as solutions to that problem. Illustratively, Japanese Patent Laid-open No. Sho 64-35421 discloses a wiring structure having a metal subject to high anodic oxidation and a metal of high electrical conductivity stacked one upon another.

The GOLD structure is highly effective in improving the reliability of transistors by substantially reducing peak values of drain junction fields therein. As such, the GOLD structure is thought to be an effective way to enhance the reliability of polysilicon TFTs used in liquid crystal display apparatuses. One disadvantage of the GOLD structure is that its complicated element constitution necessitates installation of elaborate fabrication processes. This has proved to be a severe problem for liquid crystal display apparatuses because cost reduction is one of their top priorities. It is difficult to implement the proposed structure unmodified as has been applied to silicon LSIs so far.

It is therefore an object of the present invention to overcome the above and other deficiencies of the prior art and to provide a highly reliable TFT structure that may be formed with a minimum of additional fabrication processes. Another object of the present invention is to provide, in addition to the dependable TFTS, a low-resistance wiring structure suitable for a liquid crystal display apparatus having a wide, fine-resolution screen.

DISCLOSURE OF INVENTION

In carrying out the invention and according to one aspect thereof, there is provided a liquid crystal display apparatus comprising a pair of substrates, one of which has a plurality of scanning wires, a plurality of signal wires intersecting the scanning wires in a matrix fashion, and a plurality of semiconductor elements placed at intersection points between the scanning wires and the signal wires. Each of the plurality of semiconductor elements includes: a semiconductor layer having an intrinsic semiconductor region and a pair of semiconductor regions of a given conductivity type which sandwich the intrinsic semiconductor region and which are each made of a high-resistance region and a low-resistance region; a first electrode formed on the intrinsic semiconductor region with an insulating film interposed therebetween; and a second and a third electrode connected to the low-resistance regions of the pair of semiconductor regions of the given conductivity type. Each of the plurality of scanning wires constitutes the first electrode of the corresponding one of the plurality of semiconductor elements. The first electrode has first wiring formed on the insulating film and second wiring formed on the first wiring, part of the second wiring being overlaid on part of the high-resistance regions of the pair of semiconductor regions of the given conductivity type with the insulating film interposed therebetween.

In a preferred structure according to the invention, the second wiring may be formed so as to cover the first wiring. The second wiring may preferably be formed on sides of the first wiring. Ends of the second wiring may be tapered.

In a further preferred structure according to the invention, the low-resistance regions of the pair of semiconductor elements of the given conductivity type may be formed in self-aligned relation to the second wiring. With this structure, boundaries of the low-resistance regions which are viewed in perpendicular relation to the substrates may coincide with boundaries of the second wiring which are viewed in perpendicular relation to the substrates.

In yet another preferred structure according to the invention, the second wiring may be formed on the first wiring with an insulating film interposed therebetween. With this structure, the first and the second wiring may be connected via contact holes to ensure the same potential over the wiring.

According to the invention, the first electrode (gate electrode) of each semiconductor element (TFT) and the high-resistance semiconductor layer are arranged to overlap to form the so-called GOLD structure. This structure allow the resistance of the high-resistance semiconductor layer to be controlled (i.e., lowered) by the gate electrode. That in turn attenuates electrical fields in the high-resistance semiconductor layer to forestall element deterioration caused by the injection of hot carriers into an insulating film over the high-resistance semiconductor layer, a phenomenon specific to the LDD structure. Lowering the resistance of the high-resistance semiconductor layer prevents lessening, due to the presence of that layer, of the ability of the elements to drive currents. Such improvements combine to provide highly reliable TFTs offering an enhanced current driving capability.

A minimum process increase is required to implement the above structure: a process for forming and patterning the second wiring need only be added.

It is not mandatory to cover the first wiring with the second wiring as long as the second wiring is kept equal in potential to the first wiring. That is, the second wiring may be formed on the first wiring with an insulating film interposed therebetween. In this case, however, the first and the second wiring must be connected outside the elements.

When the first wiring is isolated from the second wiring by the insulating film, the two kinds of wiring may be arranged to constitute an additional capacity to retain electrical charges. If the thickness of a second insulating film is suitably reduced, the added capacity increases the capacity value per unit area while the area occupied by that capacity is lessened. This contributes to enlarging the numerical aperture of pixels.

The GOLD structure above is effective not only in enhancing the reliability of TFTs but also in suppressing leak currents through TFTs attributable to photoelectric currents. With the active matrix liquid crystal display apparatus, lighting coming from backlight devices is switched on and off by liquid crystal. On that apparatus, the TFTs are necessarily exposed to the backlight. A light beam hitting any TFT causes the internal photoelectric effect within a semiconductor layer to generate electron-hole pairs flowing as a current. What is worrying in particular is an increase of leak currents when the TFTs are turned off. The problem becomes pronounced with projection type display apparatuses because of high levels of light intensity involved. Photoelectric leak currents are known to appear particularly in high electrical field regions close to drains. The problem may be bypassed when the low-resistance semiconductor layer is formed in self-aligned relation to the second wiring, i.e., when the entire top surface of the high-resistance semiconductor layer subject to high electrical fields is covered with the second wiring. This arrangement prevents light from reaching the regions most prone to generate photoelectric currents, thereby implementing TFTs with small leak currents.

Preferably, ends of the second electrodes may be tapered by etching. This structure helps prevent disconnected staggers in staggered portions of the top-layer wiring.

Generally, it is difficult during the taper etching process to control pattern dimensions within a large-area substrate. In a single-drain structure in which gate electrodes form only a single layer, variations in the pattern dimensions translate unmitigated into variations of TFT gate lengths. This results in irregularly distributed current driving capabilities of the TFTs over the substrate, making uniform image displays difficult.

Since the TFT gate length is defined by the fabricated size of the first wiring, the tapering of the second wiring by anisotropic etching of high pattern accuracy makes it possible both to ease the staggered configuration and to control the gate length with high precision. Although tapering the second wiring necessarily entails its dimensional variations which add to variations in the overlapping length of the gates and high-resistance semiconductor layer, such variations in the second wiring dimensions are not associated with the gate length. Because variations in the overlapping length do not affect the current driving capability of the TFTs as much as variations in the gate length, the uniformity of TFT characteristics within the substrate surface is not adversely affected by the tapered formation.

The first wiring may be formed preferably by any one of elements Si, Nb, Ta, Mo, W, Al, Ti, Fe, Cr, V and Zr; or by an ally of Si or N and any one of Nb, Ta, Mo, W, Al, Ti, Fe, Cr, V and Zr. The second wiring may be formed preferably by any one of Nb, Ta, Mo, W, Al, Ti, Fe, Cr, V and Zr; or by an ally of Si or N and any one of Nb, Ta, Mo, W, Al, Ti, Fe, Cr, V and Zr. The first and the second wiring may both be made of the same material.

Other objects, features and advantages of the present invention will become more apparent in the following specification and accompanying drawings.

BRIEF DESCRIPTION OF DRAWINGS

FIG. 15 is a cross-sectional view of pixels used by the liquid crystal display apparatus practiced as the seventh embodiment, the view being taken in a direction A–A'.

FIG. 16 is a cross-sectional view of pixels used by the liquid crystal display apparatus practiced as the seventh embodiment, the view being taken in a direction B–B'.

FIG. 25 is a cross-sectional view showing a process of fabricating thin film transistors used by the liquid crystal display apparatus practiced as the fifth embodiment.

FIG. 26 is a cross-sectional view showing another process of fabricating thin film transistors used by the liquid crystal display apparatus practiced as the fifth embodiment.

BEST MODE FOR CARRYING OUT THE INVENTION

The best mode for carrying the invention will now be described with reference to the accompanying drawings.

Figure 1:
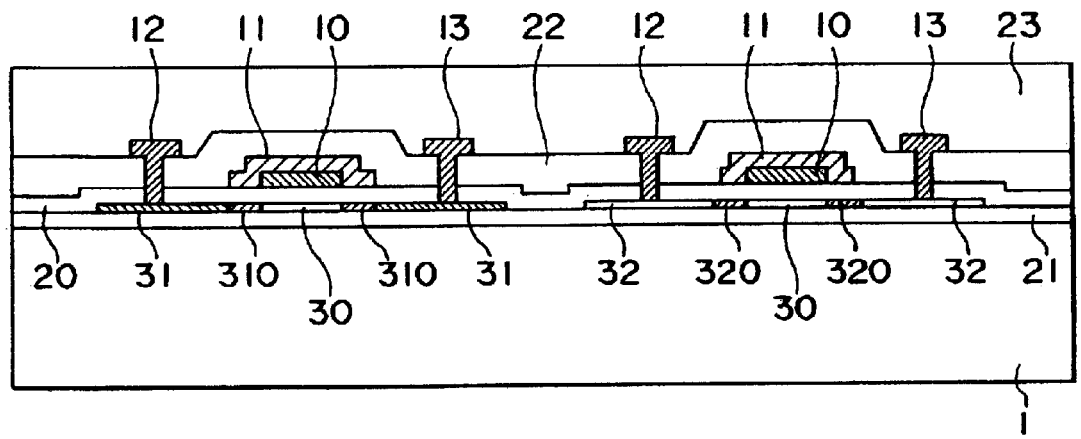
FIG. 1 is a cross-sectional view of thin film transistors used by a liquid crystal display apparatus practiced as a first embodiment of the invention.

FIG. 1 is a cross-sectional view of thin film transistors (TFTs) used by a liquid crystal display apparatus practiced as the first embodiment of the invention. On the left in FIG. 1 is an n-type TFT for use by CMOS peripheral driving circuits and an image display unit; on the right is a p-type TFT for use by CMOS driving circuits. The TFTs are formed on a buffer insulating film 21 deposited over a glass substrate 1. The buffer layer 21 is made of an $SiO_2$ film that prevents the diffusion of impurities from the glass substrate 1. An intrinsic polysilicon film 30 is formed on the buffer layer 21. The intrinsic polysilicon film 30 is in contact with a pair of high-resistance n-type polysilicon layers 310 and with a pair of high-resistance p-type polysilicon layers 320.

The pairs of high-resistance polysilicon layers 310 and 320 are in contact with a low-resistance n-type polysilicon layers 31 and a low-resistance p-type polysilicon layer 32 respectively. First gate wiring 10 made of aluminum is formed on these polysilicon layers, with an $SiO_2$ gate insulating film 20 interposed therebetween. The first gate wiring 10 is covered with second gate electrodes 11 made of Nb. These components are all covered with an interlayer insulating film 22 made of $SiO_2$. Through contact holes made in the interlayer insulating film 22, drain electrodes 12 and source electrodes 13 are connected to the low-resistance polysilicon layers 31 and 32. The entire element is covered with a protective insulating film 23 made of $Si_3N_4$.

As a characteristic of the first embodiment, the pair of high-resistance polysilicon layers 310 or 320 are formed in self-aligned relation to the pattern of the first gate wiring 10. In other words, the boundaries between the intrinsic polysilicon layer 30 and the high-resistance polysilicon layers 310 or 320 coincide with the pattern edges of the first gate electrodes 10. Part of the second gate electrodes 11 and part of the high-resistance polysilicon layers 310 or 320 are arranged to overlap, with the gate insulating film interposed therebetween.

When part of the gate electrodes and part of the high-resistance polysilicon layers 310 and 320 are overlaid to have the gate electrodes reduce the resistance of the polysilicon layers, the intensity of lateral fields in the high-resistance polysilicon layers 310 and 320 is eased and the reliability of the elements is thereby enhanced. Because the first embodiment utilizes low-resistance aluminum to make up the first gate electrodes 10, signal delays caused by the wiring resistance are lessened. That in turn contributes to making the display apparatus wider in area and finer in resolution than before.

Where aluminum components are covered with niobium (Nb), growth of aluminum hillocks is inhibited during heat treatment. This forestalls short-circuiting between the aluminum components and the wiring thereon.

Figure 2:
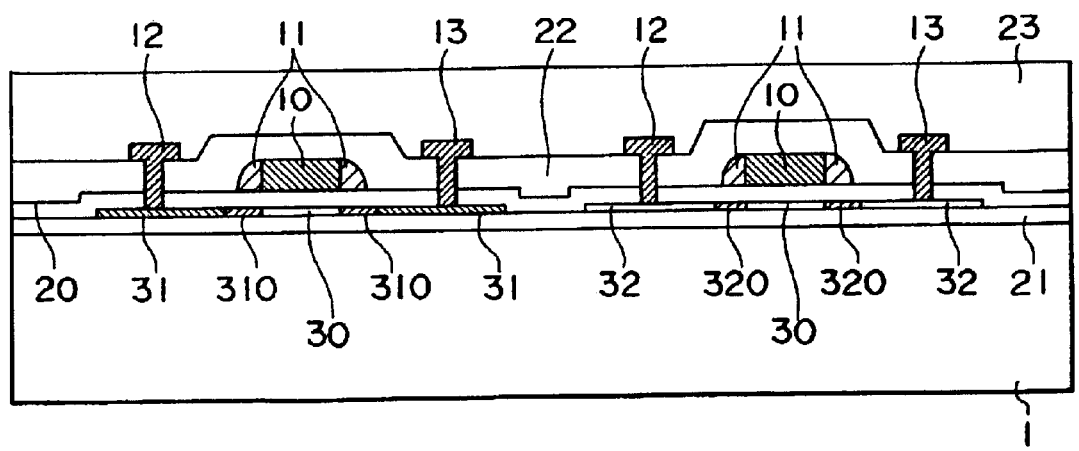
FIG. 2 is a cross-sectional view of thin film transistors used by a liquid crystal display apparatus practiced as a second embodiment of the invention.

FIG. 2 is a cross-sectional view of thin film transistors (TFTs) used by a liquid crystal display apparatus practiced as the second embodiment of the invention. The second embodiment is basically the same in structure as the first embodiment except that the second gate electrodes 11 are formed only on sides of the first gate electrodes 10 to ensure lateral contact therebetween.

The second embodiment uses Nb to constitute the first gate electrodes and NbN to make up the second gate electrodes. The second gate electrodes are formed only on sides of the first gate electrodes as follows: an NbN film is first formed all over the substrate, and then etched by a strongly anisotropic reactive ion etching method. In functional terms, the second gate electrodes 11 are connected to the first gate electrodes 10 as in the case of the first embodiment. This also eases the intensity of lateral fields in the high-resistance polysilicon layers 310 and 320 and thereby improves the reliability of the elements. Because the second embodiment has no need for a photo resist forming process to fabricate the second gate electrodes 12, the production steps are made simpler and the cost of manufacture is lowered.

Figure 3:
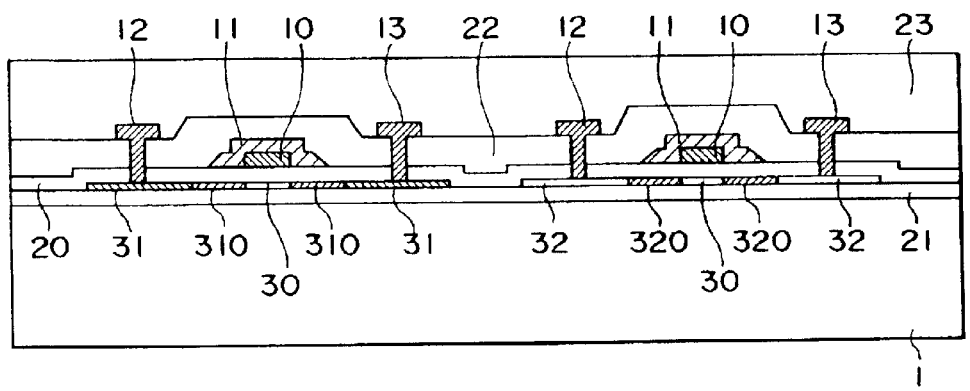
FIG. 3 is a cross-sectional view of thin film transistors used by a liquid crystal display apparatus practiced as a third embodiment of the invention.

FIG. 3 is a cross-sectional view of thin film transistors (TFTs) used by a liquid crystal display apparatus practiced as the third embodiment of the invention. The third embodiment is basically the same in structure as the first embodiment except that ends of the second gate electrodes 11 are tapered. The tapered ends of the gate electrodes are effective in preventing disconnection at upper-layer electrodes (specifically, source and drain electrodes) climbing over the gate electrodes.

Because the gate length of the TFTs is determined by the fabricated dimensions of the first gate wiring, the first gate wiring is formed perpendicularly by anisotropic etching of high pattern precision, with the second gate wiring tapered on top. This structure helps ease the staggered configuration and control the gate length accurately at the same time. The second gate wiring when tapered necessarily involves dimensional variations which add to variations in the overlapping length of the gates and high-resistance semiconductor layer. However, such variations in the second gate wiring dimensions are not associated with the gate length. Because variations in the overlapping length do not affect the current driving capability of the TFTs as much as variations in the gate length, the uniformity of TFT characteristics within the substrate surface is not adversely affected by the tapered formation. Thus the structure of the third embodiment not only prevents severed wires in the upper-layer wiring but also ensures uniform TFT characteristics inside the substrate.

Figure 4:
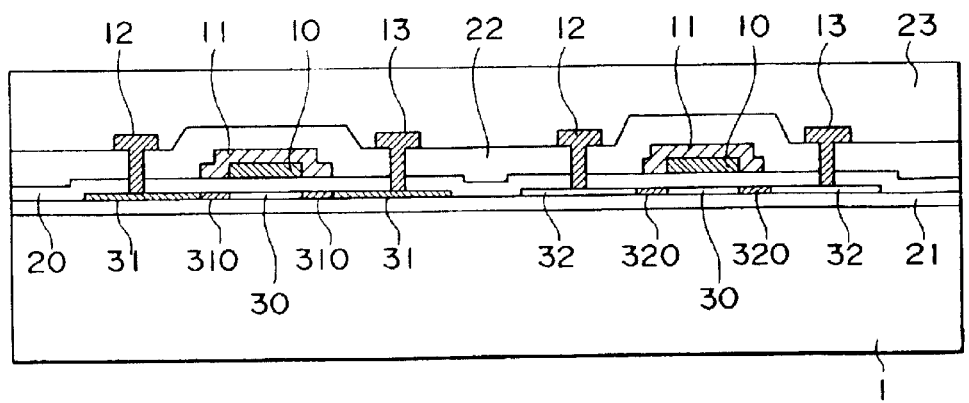
FIG. 4 is a cross-sectional view of thin film transistors used by a liquid crystal display apparatus practiced as a fourth embodiment of the invention.

FIG. 4 is a cross-sectional view of thin film transistors (TFTs) used by a liquid crystal display apparatus practiced as the fourth embodiment of the invention. The fourth embodiment is basically the same in structure as the first embodiment except that the low-resistance polysilicon layers 31 and 32 and the second gate electrodes 11 are formed in self-aligned relation to one another. That is, the boundaries between the high-resistance polysilicon layers 310 and 320 on the one hand and the low-resistance polysilicon layers 31 and 32 on the other hand coincide with the edges of the second gate electrodes 11. This structure almost completely shields the high-resistance semiconductor layers 310 and 320, major sources of photoelectric currents, against light from above the substrate, whereby leak currents of the TFTs are reduced. The structure is particularly effective when implemented in a liquid crystal display panel used by a projection type display device subject to high levels of light intensity.

Figure 5:
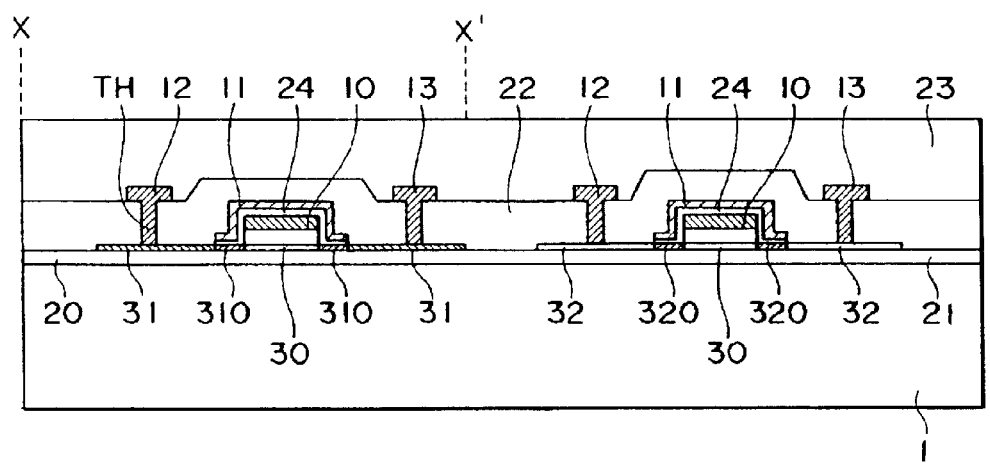
FIG. 5 is a cross-sectional view of thin film transistors used by a liquid crystal display apparatus practiced as a fifth embodiment of the invention, the view being taken in a direction X–X'.
Figure 6:
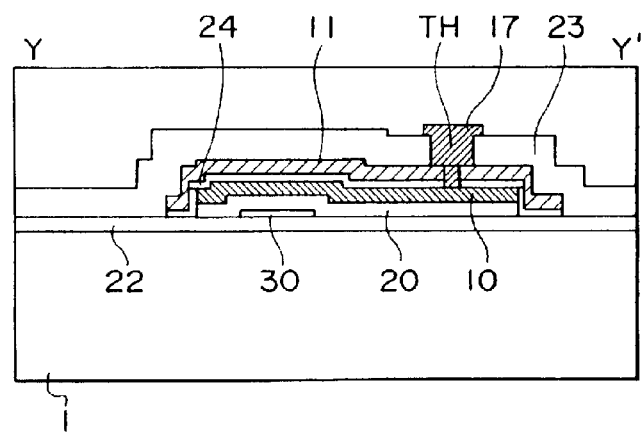
FIG. 6 is a cross-sectional view of thin film transistors used by the liquid crystal display apparatus practiced as the fifth embodiment, the view being taken in a direction Y–Y'.
Figure 7:
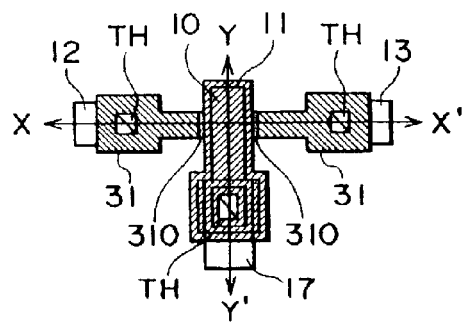
FIG. 7 is a plan view of thin film transistors used by the liquid crystal display apparatus practiced as the fifth embodiment.

FIGS. 5, 6 and 7 show thin film transistors (TFTs) used by a liquid crystal display apparatus practiced as another embodiment of the invention. FIG. 7 is a plan view of the thin film transistors, FIG. 5 is a cross-sectional view of the thin film transistors taken on line X–X' in FIG. 7, and FIG. 6 is a cross-sectional view of the thin film transistors taken on line Y–Y'.

The fifth embodiment is basically the same in structure as the first embodiment except that the first gate electrodes 10 are isolated from the second gate electrodes 11 by an insulating film 24. As depicted in FIG. 6, the first and second gate electrodes 10 and 11 isolated by the insulating film 24 are interconnected by connection electrodes 17 that pass through holes in the second gate electrodes 11 and insulating film 24 as well as through contact holes TH in the interlayer insulating film 22. The structure provides the second gate electrodes 11 with the same potential as that of the first gate electrodes 10. This makes it possible, as in the first embodiment, to attenuate lateral fields in the high-resistance polysilicon layers 310 and 320 so as to enhance element reliability. Other benefits of this embodiment will become apparent when explained later in connection with other embodiments.

Figure 8:
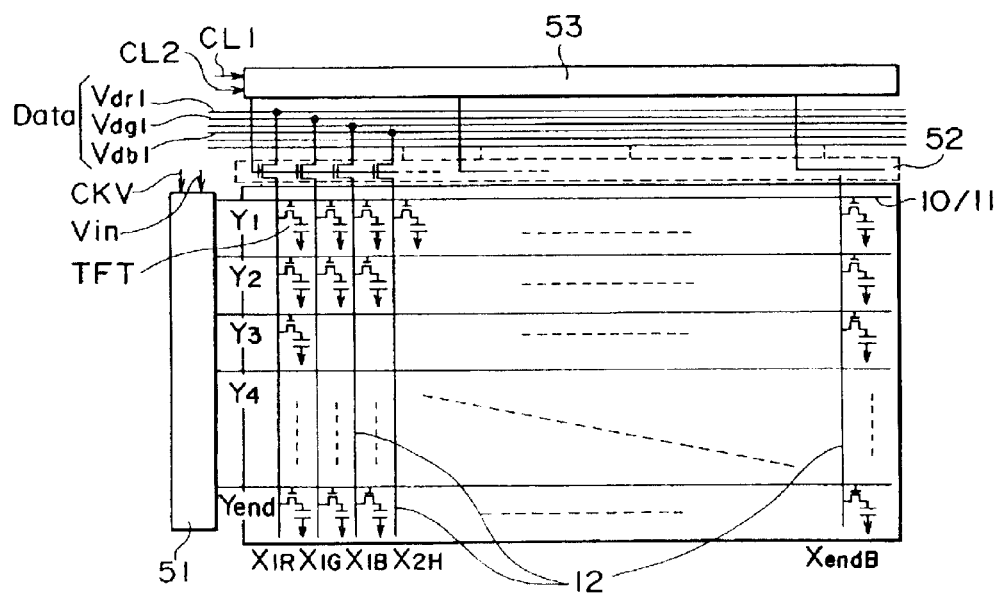
FIG. 8 is an overall block diagram of a liquid crystal display apparatus practiced as a sixth embodiment of the invention.

FIG. 8 is an equivalent circuit diagram of a display apparatus that integrates peripheral driving circuits and a TFT active matrix on a single substrate. The apparatus comprises a TFT active matrix 50 according to the invention; a vertical scanning circuit 51 that drives the matrix 50; a horizontal scanning circuit 53 that divides a video signal per scanning line into a plurality of blocks to be supplied on a time division basis; data signal lines Vdr1, Vdg1, Vdb1, . . . , for supplying a video signal "Data"; and a switch matrix circuit 52 that feeds the video signal one divided block at a time to the active matrix 50.

Figure 9:
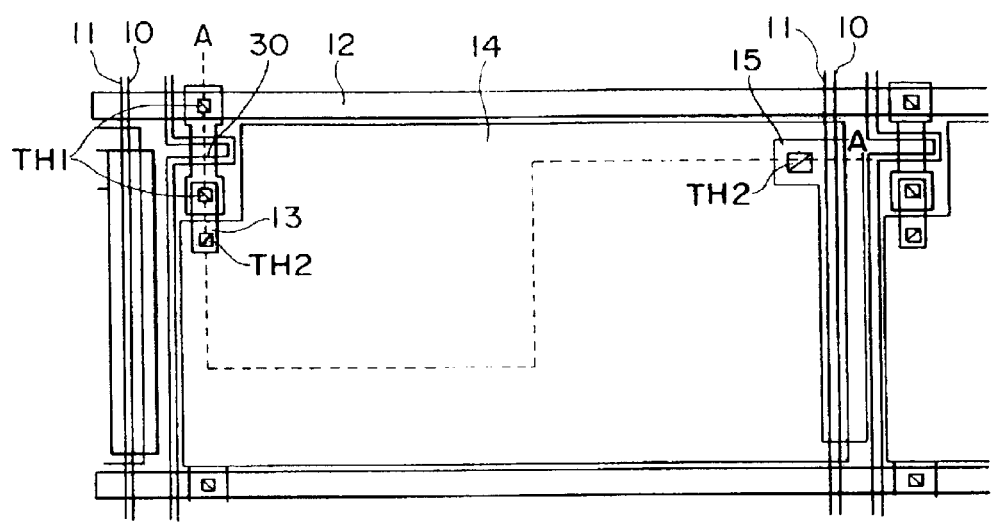
FIG. 9 is a plan view of pixels used by the liquid crystal display apparatus practiced as the sixth embodiment.
Figure 10:
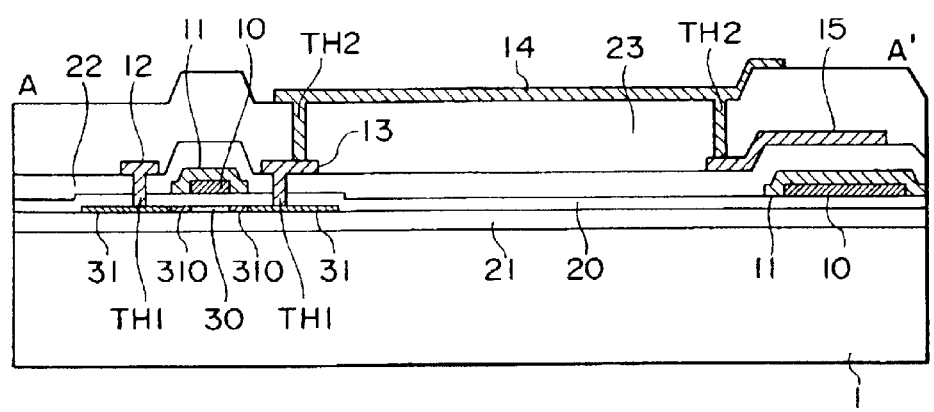
FIG. 10 is a cross-sectional view of pixels used by the liquid crystal display apparatus practiced as the sixth embodiment.

FIGS. 9 and 10 are a plan view and a cross-sectional view, respectively, of pixels used by the liquid crystal display apparatus practiced as another embodiment of this invention. The sectional view of FIG. 10 is taken on line A–A' in FIG. 9. The structure of the TFT is the same as that of the first embodiment in FIG. 1. The active matrix comprises gate electrodes 10 and 11 formed on a glass substrate; signal electrodes 12 formed so as to intersect the gate electrodes 10 and 11; TFTs formed near the intersection points of these electrodes; and pixel electrodes 14 each having one end connected to a source electrode 13 of a TFT via a contact hole TH2 in a protective insulating film 23. Another end of the pixel electrode 14 is connected to a capacity electrode 15 via a contact hole TH2 in the protective insulating film 23. The capacity electrodes 15 and the contiguous gate electrodes 11 make up an additional capacity therebetween.

Figure 11:
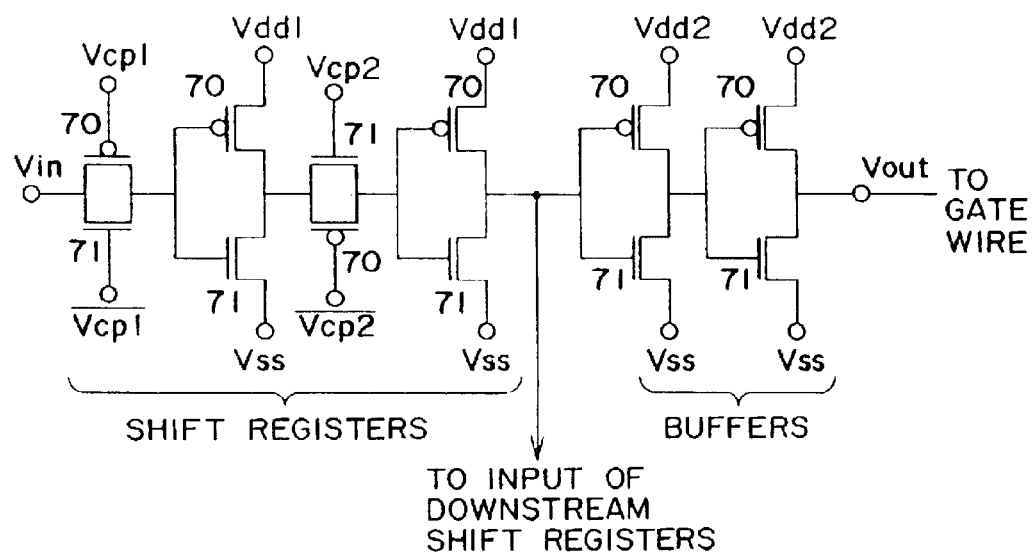
FIG. 11 is a circuit diagram of a vertical side driving circuit used by the liquid crystal display apparatus practiced as the sixth embodiment.

The vertical scanning circuit 51 and horizontal scanning circuit 53 are each constituted by shift registers and buffers shown in FIG. 11 and are driven by clock signals CL1, C12 and CKV. In FIG. 11, reference numeral 70 stands for a p-type transistor and 71 for an n-type transistor. The transistors are timed by two-phase clock signals (Vcp1, Vcp2) and their inverted clock signals (/Vcp1, /Vcp2,) to invert and shift an input voltage before transferring the voltage to the buffers. The transferred voltage also constitutes an input voltage toward downstream shift registers corresponding to the next scanning line. The buffers output a pulse voltage at a maximum voltage level of Vdd2; the voltage makes up a scanning voltage used by the active matrix display.

Figure 12:
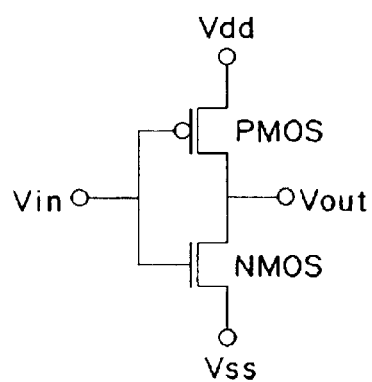
FIG. 12 is a schematic view of an inverter device used by a driving circuit of the liquid crystal display apparatus practiced as the sixth embodiment.
Figure 13:
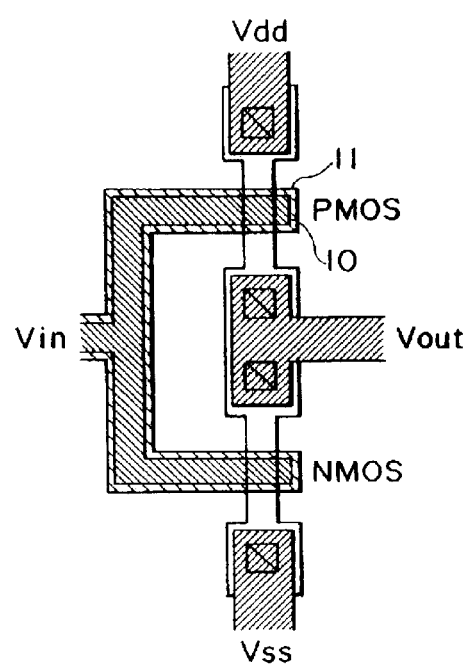
FIG. 13 is a plan view of an inverter device used by a driving circuit of the liquid crystal display apparatus practiced as the sixth embodiment.

FIGS. 12 and 13 are a schematic circuit diagram and a plan view, respectively, of an inverter device used by the driving circuit described above. A p-type and an n-type transistor making up the inverter may each have any one of two-layer gate electrode structures (10, 11) shown in FIGS. 1 through 6.

Incorporating the inventive TFTs into the active matrix display and driving circuit makes it possible to constitute a highly reliable display apparatus free of image quality degradation.

Figure 14:
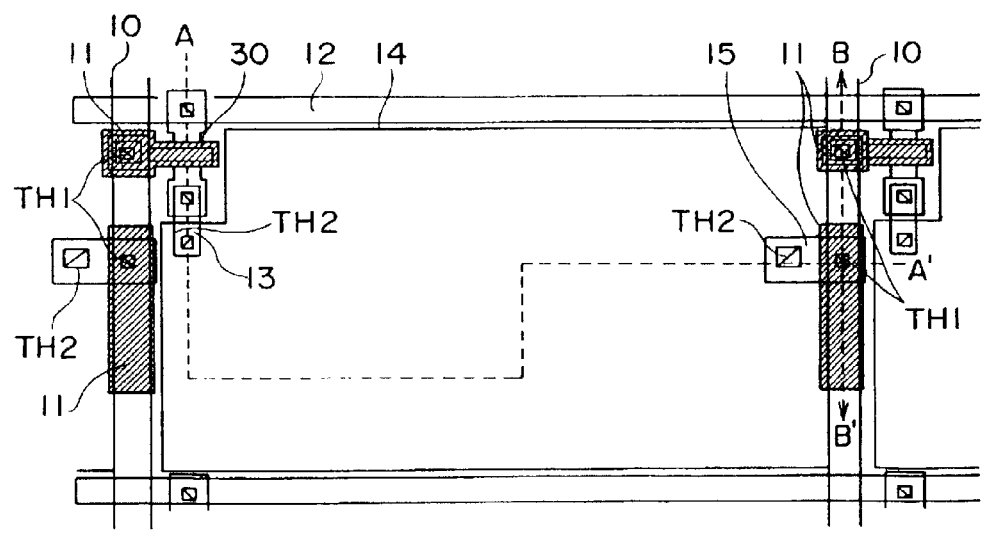
FIG. 14 is a plan view of pixels used by a liquid crystal display apparatus practiced as a seventh embodiment of the invention.

FIGS. 14 through 16 are a plan view and cross-sectional views of pixels used by an active matrix display comprising the TFTs shown in FIGS. 5 through 7. FIG. 15 is a cross-sectional view taken on line A–A' in FIG. 14, and FIG. 16 is a cross-sectional view taken on line B–B' in FIG. 14.

In the TFTs of this embodiment, the first and second gate electrodes 10 and 11 are isolated from one another by the insulating film 24. The first and second gate electrodes 10 and 11 are interconnected by the connection electrodes 17 that pass through holes in the second gate electrodes 11 and insulating film 24 as well as through contact holes TH1 in the interlayer insulating film 22.

As depicted in FIG. 15, one end of each pixel electrode 14 is connected to the source electrode 13 of a TFT via a contact hole TH2 in the protective insulating film 23; another end of the pixel electrode 14 is connected to a connection electrode 15 through a contact hole TH2 in the protective insulating film 23. Each connection electrode 15 is in turn connected to an adjacent second gate electrode 11 through a contact hole TH1 in the interlayer insulating film 22. The connection electrode 15 and its contiguous first electrode 10 constitute an additional capacity therebetween.

As described, placing the insulating layer 24 between two layers of gate electrodes for isolation purposes allows the components involved to constitute an additional capacity. The capacity thus added may be increased per unit area by suitably reducing the thickness of the insulating film 24. When the area occupied by the added capacity is reduced, the pixel numerical aperture is improved. With the deterioration of the TFTs forestalled as in other embodiments of this invention, the TFTs above obviously make up another factor contributing to the implementation of a fine-resolution display apparatus.

Figure 17:
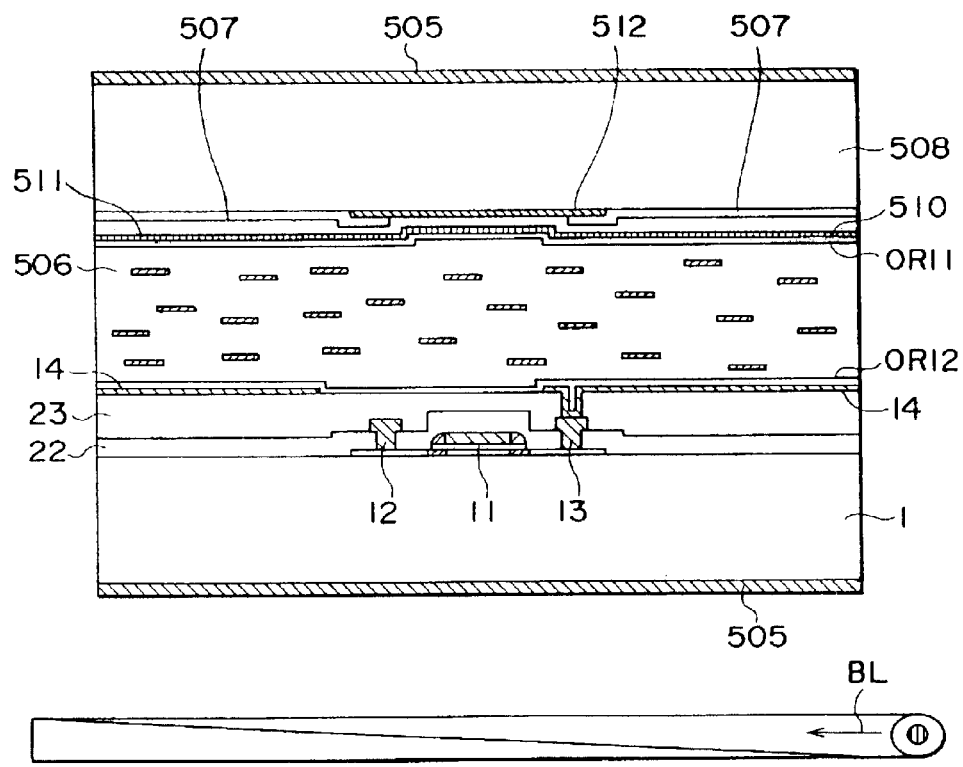
FIG. 17 is a cross-sectional view of cells used by a liquid crystal display apparatus embodying the invention.

FIG. 17 is a cross-sectional view of liquid crystal cells used by a liquid crystal display apparatus embodying the invention. A glass substrate 1 under a liquid crystal layer 506 has gate electrodes 11 and 10 and video signal electrodes 12 arranged in matrix fashion. Pixel electrodes 14 made of ITO are driven by TFTs formed close to intersection points between the gate and video signal electrodes. Another glass substrate 508 above the liquid crystal layer 506 facing the other substrate comprises counter electrodes 510 made of ITO, a color filter 507, a color filter protective film 511, and a shielding film 512 constituting a shielding black matrix pattern. Polarizing plates 505 are formed on the outer surfaces of the paired glass substrates 1 and 508. The liquid crystal layer 506 is contained between a lower and an upper orienting film ORI1 and ORI2 for orienting liquid crystal molecules, sealed by sealing materials SL (not shown). The lower orienting film ORI1 is formed over the protective insulating film 23 on the side of the glass substrate 1. The shielding film 512, color filter 507, color filter protective film 511, counter electrodes 510, and upper orienting film ORI2 are stacked one upon another on the inner surface of the opposite glass substrate 508.

This liquid crystal display apparatus is assembled by first forming separately the layers on the glass substrate 1 and on the opposite glass substrate 508. The upper and lower glass substrates 1 and 508 are then positioned face to face and arranged to contain the liquid crystal 506 therebetween. Transmitted light from backlights BL is adjusted by the pixel electrodes 14, which constitutes a TFT-driven color liquid crystal display apparatus. When the semiconductor elements discussed above are used as TFTs for driving the pixel electrodes 14 and as TFTs of the driving circuit, a highly reliable fine-resolution TFT type liquid crystal display apparatus is implemented.

Steps to fabricate the TFTs shown in FIG. 1 will now be described by referring to FIGS. 18 through 21. In each of the drawings, a p-type TFT for use by the driving circuit is indicated on the right, and an n-type TFT used by the active matrix display is depicted on the left. The n-type TFTS in the driving circuit have the same structure and thus will not be illustrated further.

Figure 18:
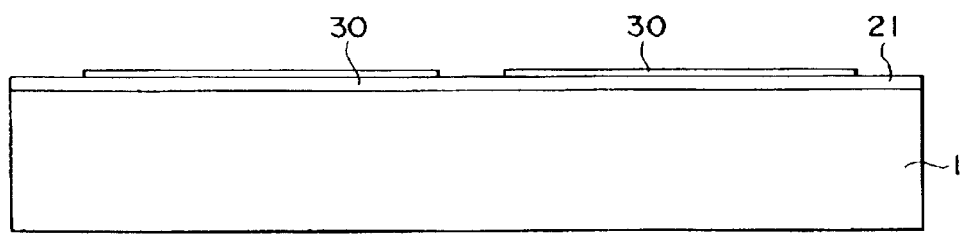
FIG. 18 is a cross-sectional view showing a process of fabricating thin film transistors used by the liquid crystal display apparatus practiced as the first embodiment.

An $SiO_2$ film 21 serving as a buffer layer is deposited to a thickness of 300 nm by plasma CVD on the glass substrate 1. Amorphous silicon (a-Si) film is then deposited to 35 nm thick by plasma CVD. The amorphous silicon film is patterned as desired by a known photolithography method. The patterned silicon film is subjected to irradiation of XeCl excimer laser (with wavelength of 308 nm) for recrystallization, which provides a polysilicon (poly-Si) film 30 (FIG. 18).

Figure 19:
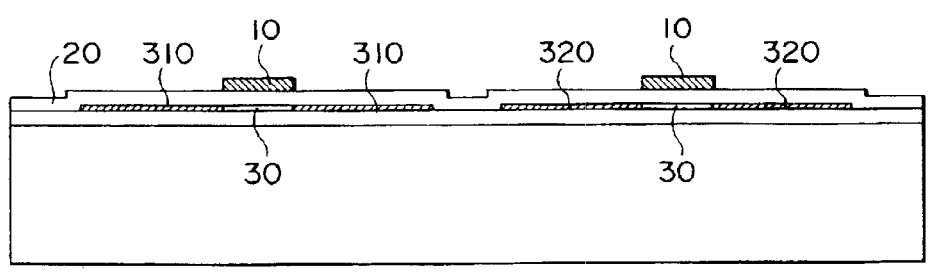
FIG. 19 is a cross-sectional view showing another process of fabricating thin film transistors used by the liquid crystal display apparatus practiced as the first embodiment.

An $SiO_2$ film 20 serving as a gate insulating film is deposited to a thickness of 80 nm by plasma CVD. Aluminum (Al) is then deposited by sputtering to 150 nm thick and patterned into first gate electrodes 10. With the p-type TFTs protected by a photo resist, phosphorus (P) is injected only into the n-type TFTs at $1\times10^{14}$ ($cm^{-2}$) using the first gate electrodes 10 as a mask. This forms a high-resistance n-type polysilicon layer 310. The same step is repeated on the p-type TFTS to form a high-resistance p-type polysilicon film 320. In the latter process, boron (B) is injected instead of phosphorus (FIG. 19).

An Nb film is deposited to a thickness of 200 nm by sputtering. The deposited film is patterned so as to cover the first gate electrodes 10, whereby second gate electrodes 11 are obtained. With the p-type TFTs protected by a photo resist, phosphorus (P) is injected only into the n-type TFTs at $3\times10^{15}$ ($cm^{-2}$) using the first gate electrodes 10 as a mask. This forms a low-resistance n-type polysilicon layer 31. The same step is repeated on the p-type TFTs to form a low-resistance p-type polysilicon layer 32. In the latter process, boron (B) is injected instead of phosphorus.

Figure 20:
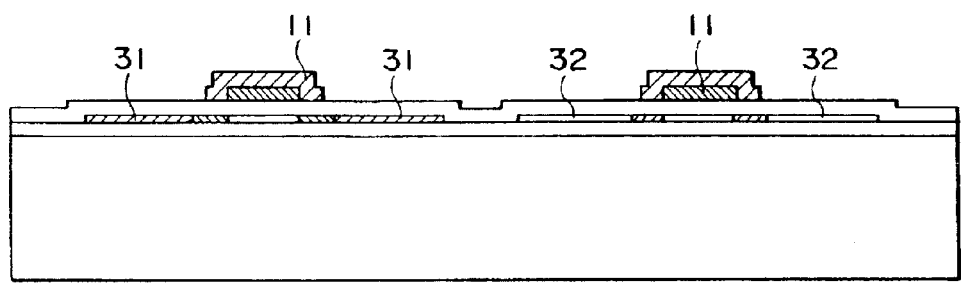
FIG. 20 is a cross-sectional view showing another process of fabricating thin film transistors used by the liquid crystal display apparatus practiced as the first embodiment.

XeCl excimer laser (with wavelength of 308 nm) is again applied. The laser irradiation activates the injected impurities (FIG. 20).

Figure 21:
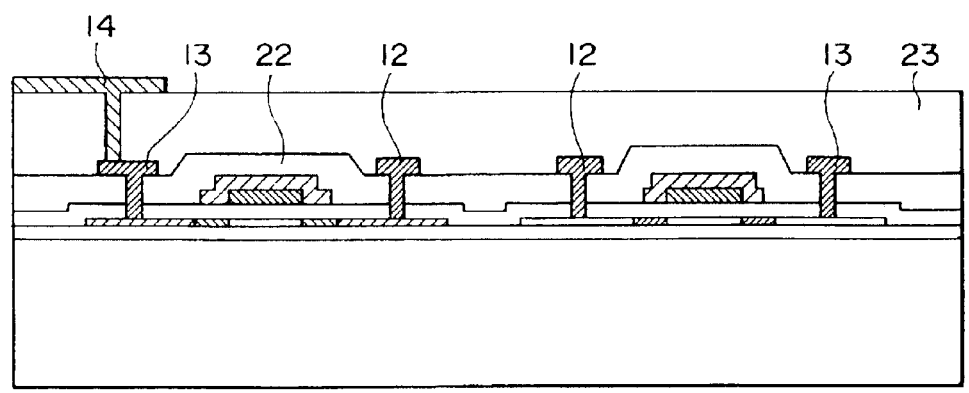
FIG. 21 is a cross-sectional view showing another process of fabricating thin film transistors used by the liquid crystal display apparatus practiced as the first embodiment.

An $SiO_2$ film serving as an interlayer insulating film 22 is deposited to a thickness of 400 nm by plasma CVD, and contact holes are made therein. A CrMo alloy film is then deposited to 400 nm thick by sputtering and patterned into source and drain electrodes. An $Si_3N_4$ film acting as a protective insulating film 23 is deposited to 500 nm thick by plasma CVD, and contact holes are made therein. Lastly, an ITO film is deposited to 70 nm thick by sputtering and patterned into pixel electrodes 14 (FIG. 21).

The above embodiment of the invention permits fabrication of a highly reliable TFT active matrix with low-resistance gate wiring by simply adding the process of forming the second gate electrodes. Any increase in the cost of manufacturing is thus minimized.

Figure 22:
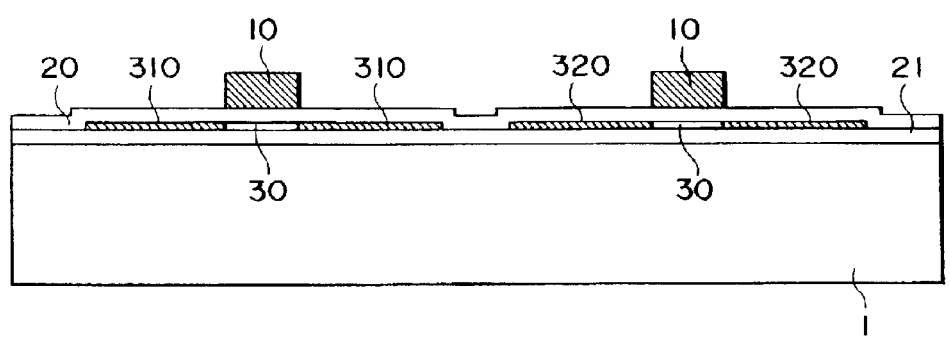
FIG. 22 is a cross-sectional view showing a process of fabricating thin film transistors used by the liquid crystal display apparatus practiced as the second embodiment.
Figure 23:
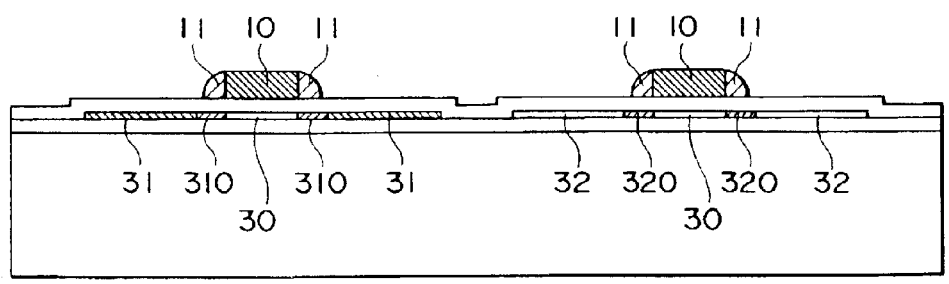
FIG. 23 is a cross-sectional view showing another process of fabricating thin film transistors used by the liquid crystal display apparatus practiced as the second embodiment.
Figure 24:
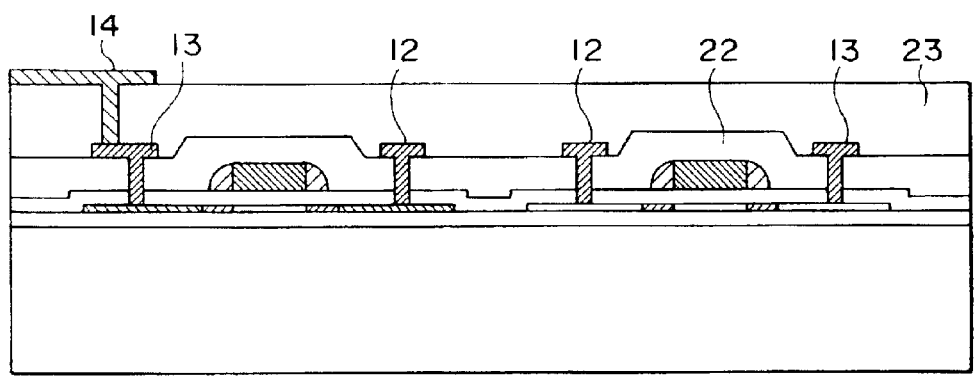
FIG. 24 is a cross-sectional view showing another process of fabricating thin film transistors used by the liquid crystal display apparatus practiced as the second embodiment.

Steps to fabricate the TFTs shown in FIG. 2 will now be described by referring to FIGS. 22 through 24. In each of the drawings, a p-type TFT for use by the driving circuit is indicated on the right, and an n-type TFT used by the active matrix display is depicted on the left. The n-type TFTs in the driving circuit have the same structure and thus will not be illustrated further.

An SiO$_2$ film 21 serving as a buffer layer is deposited to a thickness of 300 nm by plasma CVD on the glass substrate 1. Amorphous silicon (a-Si) film is then deposited to 35 nm thick by plasma CVD. The amorphous silicon film is patterned as desired by a known photolithography method. The patterned silicon film is subjected to irradiation of XeCl excimer laser (with wavelength of 308 nm) for recrystallization, which provides a polysilicon (poly-Si) film 30. The steps up to this point are the same as those applicable to FIG. 18 and will not be illustrated further.

An SiO$_2$ film 20 serving as a gate insulating film is deposited to a thickness of 80 nm by plasma CVD. The deposited film is patterned into first gate electrodes 10. With the p-type TFTs protected by a photo resist, phosphorus (P) is injected only into the n-type TFTs at $1\times10^{14}$ (cm$^{-2}$) using the first gate electrodes 10 as a mask. This forms a high-resistance n-type polysilicon layer 310. The same step is repeated on the p-type TFTs to form a high-resistance p-type polysilicon film 320. In the latter process, boron (B) is injected instead of phosphorus (FIG. 22).

An NbN film is deposited to a thickness of 400 nm by sputtering. The deposited film is subjected to anisotropic etching using reactive ions. The process fabricates second gate electrodes 11 in the form of side walls on sides of the first gate electrodes 10. With the p-type TFTs protected by a photo resist, phosphorus (P) is injected only into the n-type TFTs at $3\times10^{15}$ (cm$^{-2}$) using the first gate electrodes 10 as a mask. This forms a low-resistance n-type polysilicon layer 31. The same step is repeated on the p-type TFTs to form a low-resistance p-type polysilicon layer 32. In the latter process, boron (B) is injected instead of phosphorus. XeCl excimer laser (with wavelength of 308 nm) is again applied to activate the injected impurities (FIG. 23).

An SiO$_2$ film serving as an interlayer insulating film 22 is deposited to a thickness of 400 nm by plasma CVD, and contact holes are made therein. A CrMo alloy film is then deposited to 400 nm thick by sputtering and patterned into source and drain electrodes. An Si$_3$N$_4$ film acting as a protective insulating film 23 is deposited to 500 nm thick by plasma CVD, and contact holes are made therein. Lastly, an ITO film is deposited to 70 nm thick by sputtering and patterned into pixel electrodes 14 (FIG. 24).

The above embodiment of the invention eliminates the need for a photolithography process in forming the second gate electrodes. This makes it possible to fabricate a highly reliable TFT active matrix at reduced costs.

Steps to fabricate the TFTs shown in FIGS. 5 through 7 will now be described by referring to FIGS. 24 through 28. In each of the drawings, a p-type TFT for use by the driving circuit is indicated on the right, and an n-type TFT used by the active matrix display is depicted on the left. The n-type TFTs in the driving circuit have the same structure and thus will not be illustrated further.

An SiO$_2$ film 21 serving as a buffer layer is deposited to a thickness of 300 nm by plasma CVD on the glass substrate 1. Amorphous silicon (a-Si) film is then deposited to 35 nm thick by plasma CVD. The amorphous silicon film is patterned as desired by a known photolithography method. The patterned silicon film is subjected to irradiation of XeCl excimer laser (with wavelength of 308 nm) for recrystallization, which provides a polysilicon (poly-Si) film 30 (FIG. 25).

An SiO$_2$ film 20 serving as a gate insulating film is deposited to a thickness of 80 nm by plasma CVD. An Nb film is then deposited by sputtering to 150 nm thick and patterned into first gate electrodes 10. The gate insulating film 20 is patterned successively using the first gate electrodes 10 as a mask. With the p-type TFTs protected by a photo resist, phosphorus (P) is injected only into the n-type TFTs at $1\times10^{14}$ (cm$^{-2}$) using the first gate electrodes 10 as a mask. This forms a high-resistance n-type polysilicon layer 310. The same step is repeated on the p-type TFTs to form a high-resistance p-type polysilicon film 320. In the latter process, boron (B) is injected instead of phosphorus (FIG. 26).

Figure 27:
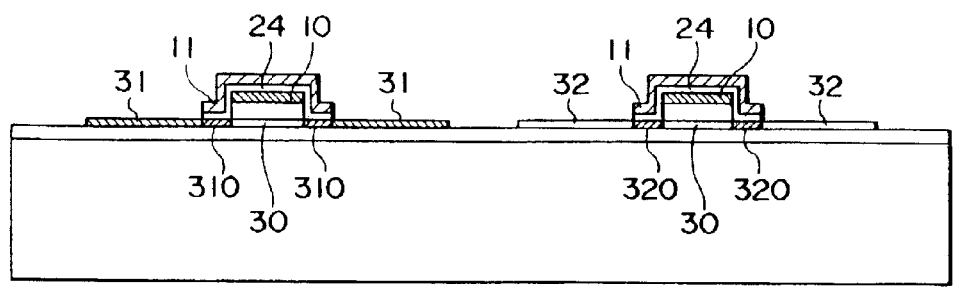
FIG. 27 is a cross-sectional view showing another process of fabricating thin film transistors used by the liquid crystal display apparatus practiced as the fifth embodiment.

An SiO$_2$ film 24 is then deposited to 100 nm thick by plasma CVD, followed by an Nb film deposited to a thickness of 100 nm by sputtering and patterned so as to cover the first gate electrodes 10. This process fabricates second gate electrodes 11. With the p-type TFTs protected by a photo resist, phosphorus (P) is injected only into the n-type TFTs at $3\times10^1$ (cm$^{-2}$) using the first gate electrodes 10 as a mask. This forms a low-resistance n-type polysilicon layer 31. The same step is repeated on the p-type TFTs to form a low-resistance p-type polysilicon layer 32. In the latter process, boron (B) is injected instead of phosphorus. XeCl excimer laser (with wavelength of 308 nm) is again applied to activate the injected impurities (FIG. 27).

Figure 28:
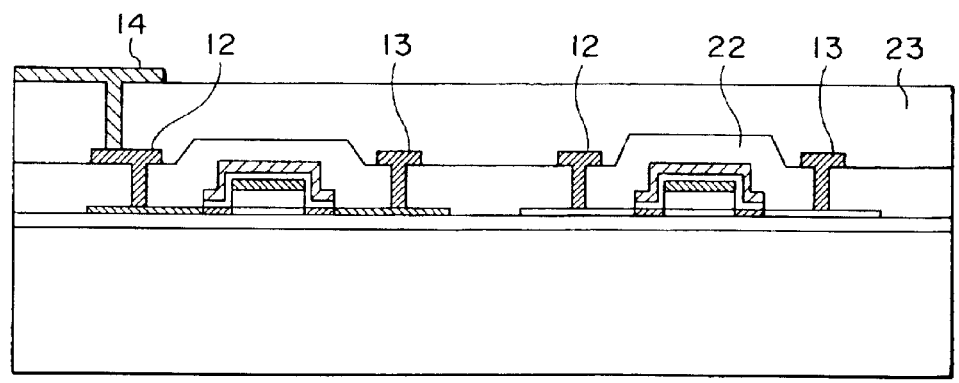
FIG. 28 is a cross-sectional view showing another process of fabricating thin film transistors used by the liquid crystal display apparatus practiced as the fifth embodiment.

An SiO$_2$ film serving as an interlayer insulating film 22 is deposited to a thickness of 400 nm by plasma CVD, and contact holes are made therein. A CrMo alloy film is then deposited to 400 nm thick by sputtering and patterned into source and drain electrodes. An Si$_3$N$_4$ film acting as a protective insulating film 23 is deposited to 500 nm thick by plasma CVD, and contact holes are made therein. Lastly, an ITO film is deposited to 70 nm thick by sputtering and patterned into pixel electrodes 14 (FIG. 28).

The above embodiment causes impurities to be injected directly into the polysilicon film, i.e., without penetration through an insulating film. This means that ion injection can take place at a significantly lowered level of energy. Specifically, an acceleration voltage of 5 kV or less permits injection of ions. The low-voltage impurity injection reduces damage to the protective resist during the ion injection process, allowing the resist to be peeled off more easily at the end of the process. Because an unsophisticated device is sufficient for carrying out the low-voltage ion injection, the outlay for equipment is reduced and so are the manufacturing costs.

As described and according to the invention, highly reliable semiconductor elements (TFTs) are formed with a minimum of increase in the fabrication steps. This makes it possible to manufacture at low costs a liquid crystal display apparatus affording fine resolution with little image quality degradation.

The invention is thus carried out to implement a low-resistance wiring structure that helps build a wide-screen high-resolution liquid crystal display apparatus with little deterioration in its image quality.

INDUSTRIAL APPLICABILITY

As described, the inventive liquid crystal display apparatus is constituted by highly reliable semiconductor elements fabricated with a minimum of increase in fabrication processes. At the same time, the apparatus embraces a low-resistance wiring structure conducive to producing a large-screen fine-resolution display with little image degradation.

What is claimed:

1. A substrate comprising:
   a plurality of scanning wires;
   a plurality of signal wires intersecting said scanning wires in a matrix fashion; and a plurality of semiconductor elements placed at intersection points between said scanning wires and said signal wires wherein each of said plurality of semiconductor elements includes: a semiconductor layer having a channel region and a pair of semiconductor regions of a given conductivity type which sandwich said channel region and which are each made of a high-resistance region and a low-resistance region; a first electrode formed on said channel region with an insulating film interposed therebetween; and a second and a third electrode connected to the low-resistance regions of said pair of semiconductor regions of said given conductivity type;

wherein each of said plurality of scanning wires comprises said first electrode of the corresponding one of said plurality of semiconductor elements; and wherein said first electrode has a first wiring formed on said insulating film and a second wiring formed on said first wiring such that said second wiring is directly in contact with a side surface of said first wiring, part of said second wiring being overlaid on part of the high-resistance regions of said pair of semiconductor regions of said given conductivity type with said insulating film interposed therebetween.

2. A substrate according to claim 1, wherein said second wiring is formed so as to cover both an upper surface and said side surface of said first wiring.

3. A substrate according to claim 1, wherein ends of said second wiring are tapered.

4. A substrate according to claim 1, wherein the low-resistance regions of said pair of semiconductor regions of said given conductivity type are formed in self-aligned relation to said second wiring.

5. A substrate comprising:
a plurality of scanning wires;
a plurality of signal wires intersecting said scanning wires in a matrix fashion; and
a plurality of semiconductor elements placed at intersection points between said scanning wires and said signal wires, wherein said plurality of scanning wires have a first wiring layer and a second wiring layer formed in direct contact with a side surface of the first wiring layer, wherein each of said plurality of semiconductor elements includes: a semiconductor layer having a channel region and a pair of semiconductor regions of a given conductivity type which sandwich said channel region and which are each made of a high-resistance region and a low-resistance region; and an electrode formed on said channel region with an insulating film interposed therebetween, and wherein each of the electrodes in said plurality of semiconductor elements is comprised of the corresponding one of said plurality of scanning wires, part of said second wiring layer being overlaid on part of the high-resistance regions of said pair of semiconductor regions of said given conductivity type with said insulating film interposed therebetween.

6. A substrate according to claim 5, wherein said second wiring is formed so as to cover both an upper surface and said side surface of said first wiring.

7. A substrate according to claim 5, wherein ends of said second wiring are tapered.

8. A substrate according to claim 5, wherein the low-resistance regions of said pair of semiconductor regions of said given conductivity type are formed in self-aligned relation to said second wiring.

9. A substrate comprising:
a display region; and
a region of driving circuits to drive said display region, wherein said display region has a plurality of first semiconductor elements arranged in a matrix fashion, wherein the driving circuit region has a plurality of second semiconductor elements, wherein each of said pluralities of first and second semiconductor elements includes: a semiconductor layer having a channel region and a pair of semiconductor regions of a given conductivity type which sandwich said channel region and which are each made of a high-resistance region and a low-resistance region; and an electrode formed on said channel region with an insulating film interposed therebetween, and wherein said electrode has a first wiring formed on said insulating film and a second wiring formed on said first wiring such that said second wiring is directly in contact with a side surface of said first wiring, part of said second wiring being overlaid on part of the high-resistance regions of said pair of semiconductor regions of said given conductivity type with said insulating film interposed therebetween.

10. A substrate according to claim 9, wherein said second wiring is formed so as to cover both an upper surface and said side surface of said first wiring.

11. A substrate according to claim 9, wherein ends of said second wiring are tapered.

12. A substrate according to claim 9, wherein the low-resistance regions of said pair of semiconductor regions of said given conductivity type are formed in self-aligned relation to said second wiring.

13. A substrate comprising:
a display region; and
means for driving said display region, wherein said display region has a plurality of first semiconductor elements arranged in a matrix fashion, wherein the driving means includes a plurality of second semiconductor elements, wherein each of said pluralities of first and second semiconductor elements includes: a semiconductor layer having a channel region and a pair of semiconductor regions of a given conductivity type which sandwich said channel region and which are each made of a high-resistance region and a low-resistance region; and an electrode formed on said channel region with an insulating film interposed therebetween, and wherein said electrode has a first wiring formed on said insulating film and a second wiring formed on said first wiring such that said second wiring is directly in contact with a side surface of said first wiring, part of said second wiring being overlaid on part of the high-resistance regions of said pair of semiconductor regions of said given conductivity type with said insulating film interposed therebetween.

14. A substrate according to claim 13, wherein said second wiring is formed so as to cover both an upper surface and said side surface of said first wiring.

15. A substrate according to claim 13, wherein ends of said second wiring are tapered.

16. A substrate according to claim 13, wherein the low-resistance regions of said pair of semiconductor regions of said given conductivity type are formed in self-aligned relation to said second wiring.

* * * * *